United States Patent
Yadav et al.

(10) Patent No.: US 11,114,443 B2
(45) Date of Patent: Sep. 7, 2021

(54) SEMICONDUCTOR STRUCTURE FORMATION

(71) Applicant: Micron Technology, Inc., Boise, ID (US)

(72) Inventors: Vivek Yadav, Boise, ID (US); Fatma Arzum Simsek-Ege, Boise, ID (US); Sanjeev Sapra, Boise, ID (US); Thomas A. Figura, Boise, ID (US); Kangle Li, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/555,565

(22) Filed: Aug. 29, 2019

(65) Prior Publication Data

US 2021/0066307 A1  Mar. 4, 2021

(51) Int. Cl.
  *H01L 27/108* (2006.01)
  *H01L 29/78* (2006.01)
  *H01L 21/67* (2006.01)
  *H01L 21/762* (2006.01)

(52) U.S. Cl.
  CPC .. *H01L 27/10876* (2013.01); *H01L 21/67069* (2013.01); *H01L 21/67075* (2013.01); *H01L 21/76205* (2013.01); *H01L 21/76224* (2013.01); *H01L 27/10888* (2013.01); *H01L 27/10891* (2013.01); *H01L 29/7846* (2013.01)

(58) Field of Classification Search
  CPC ......... H01L 27/10876; H01L 27/10891; H01L 27/10888; H01L 21/76; H01L 21/76205; H01L 21/76224; H01L 21/823481; H01L 21/823878
  See application file for complete search history.

(56) References Cited

U.S. PATENT DOCUMENTS

| 6,821,857 | B1 * | 11/2004 | Khan | H01L 21/26586 257/296 |
|---|---|---|---|---|
| 7,662,693 | B2 | 2/2010 | Bhattacharyya | |
| 7,875,529 | B2 | 1/2011 | Forbes et al. | |
| 8,274,777 | B2 | 9/2012 | Kiehlbauch | |
| 2005/0287739 | A1 * | 12/2005 | Mouli | H01L 21/765 438/257 |
| 2006/0051929 | A1 * | 3/2006 | Jin | H01L 21/02282 438/424 |
| 2014/0357033 | A1 * | 12/2014 | Mayuzumi | H01L 27/10876 438/270 |
| 2017/0243753 | A1 * | 8/2017 | Imai | H01J 37/32422 |
| 2018/0145143 | A1 * | 5/2018 | Chen | H01L 21/28202 |
| 2019/0267280 | A1 * | 8/2019 | Xu | H01L 21/31116 |

* cited by examiner

*Primary Examiner* — Julia Slutsker

(74) *Attorney, Agent, or Firm* — Brooks, Cameron & Huebsch, PLLC

(57) ABSTRACT

Systems, apparatuses, and methods related to semiconductor structure formation are described. An example method may include patterning a working surface of a semiconductor wafer. The method may further include performing a vapor etch on a first dielectric material at the working surface to recess the first dielectric material to a first intended depth of an opening relative to the working surface and to expose a second dielectric material on a sidewall of the opening. The method may further include performing a wet etch on the second dielectric material to recess the second dielectric material to the intended depth.

21 Claims, 11 Drawing Sheets

SEMICONDUCTOR STRUCTURE FORMATION

TECHNICAL FIELD

The present disclosure relates generally to semiconductor devices and methods, and more particularly to semiconductor structure formation.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), static random access memory (SRAM), synchronous dynamic random access memory (SDRAM), ferroelectric random access memory (FeRAM), magnetic random access memory (MRAM), resistive random access memory (ReRAM), and flash memory, among others. Some types of memory devices may be non-volatile memory (e.g., ReRAM) and may be used for a wide range of electronic applications in need of high memory densities, high reliability, and low power consumption. Volatile memory cells (e.g., DRAM cells) require power to retain their stored data state (e.g., via a refresh process), as opposed to non-volatile memory cells (e.g., flash memory cells), which retain their stored state in the absence of power. However, various volatile memory cells, such as DRAM cells may be operated (e.g., programmed, read, erased, etc.) faster than various non-volatile memory cells, such as flash memory cells.

DETAILED DESCRIPTION

Figure 1A:
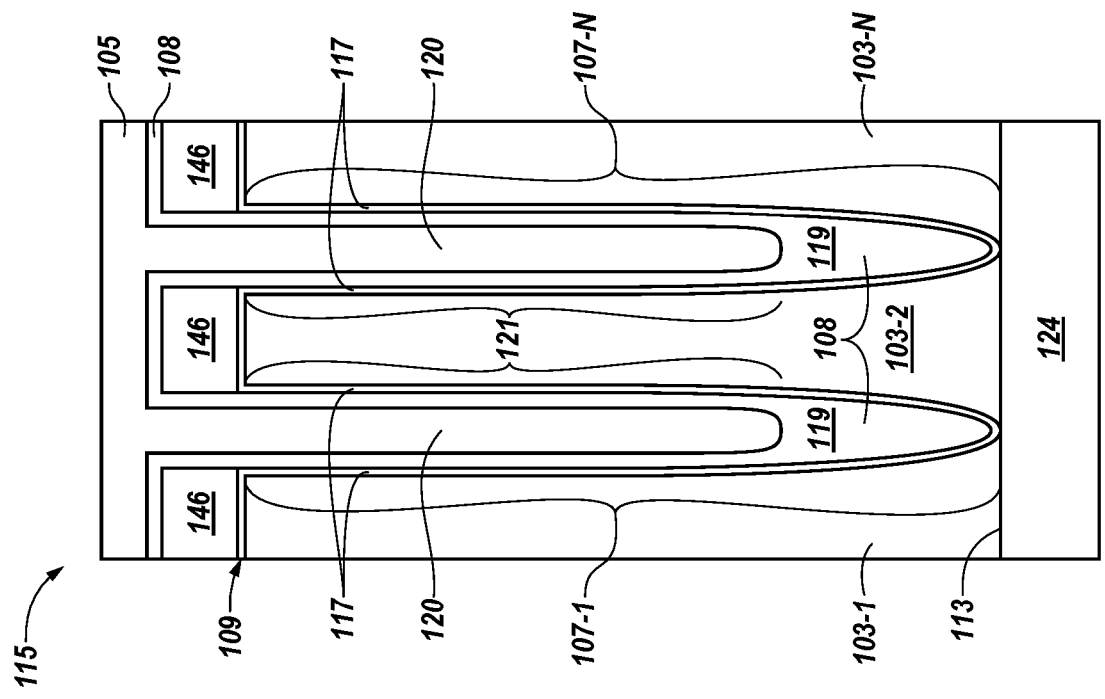
FIGS. 1A-1D illustrate example cross-sectional views of isolation trenches at particular points in an example semiconductor structure fabrication sequence in accordance with a number of embodiments of the present disclosure.

The physical size of memory devices is getting smaller. Memory devices may include memory cells including a transistor and a storage element. The transistor and storage element may be implemented as a one transistor one capacitor (1T1C) memory cell. The memory cells may be on pitch with other components of a memory devices such as sensing circuitry (e.g., sense amplifiers) and sub word line drivers (SWDs). As the pitch of these other components of the memory device decreases, the pitch of transistors of the memory device decreases as well. Decreasing the pitch of the transistors decreases the space between adjacent transistors, which may increase the probability of short channel effect (SCE) and/or random dopant fluctuation (RDF). A halo margin may be worsened and there may be a threshold voltage (Vt) mismatch between adjacent transistors. Increasing the space between adjacent transistors may reduce the probability of SCE but it also may limit the minimum pitch of other components of the memory device. Turning on and off transistors to shrinking devices and accurately detecting a stored charge during a read operation becomes more and more difficult.

In some approaches a buried recessed access device (BRAD) may be used to accommodate shrinking size. A BRAD may use doping to improve channel conductivity. Scaling BRADs for future generations has become increasingly challenging due to coupled tradeoff between gate induced drain leakage (GIDL) and subthreshold leakage. Boron implants to a channel region of a BRAD have mixed results. Methods to achieve desired Vt through boron implants come with a tradeoff of higher GIDL due to higher junction electric field implant damage. The ion implant dopants may migrate within the channel as well, thus changing the device's conductive properties. Achieving uniform channel dopant concentration in increasingly shrinking silicon devices by doping the silicon active area and activating these dopants has become more challenging with scaling.

In contrast to some previous approaches, rather than increasing or adding dopant to a channel of the device, the present disclosure describes how a Vt of a device may be independently controlled electrostatically through an adjacent isolation trench. The present disclosure includes systems, apparatuses, and methods related to semiconductor structure formation, including isolation trenches. An example method may include patterning a working surface of a semiconductor wafer. The method may further include performing a vapor etch on a first dielectric material at the working surface to recess the first dielectric material to a first intended depth of an opening relative to the working surface and to expose a second dielectric material on a sidewall of the opening. The method may further include performing a wet etch on the second dielectric material to recess the second dielectric material to the intended depth.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used herein, "a number of" something may refer to one or more such things. For example, a number of memory devices may refer to one or more memory devices and a number of cycles of particular elements recited in a claim may refer to performing the particular elements in one or more iterations. Stating that a number of cycles is "tunable" is intended to mean that the number of cycles that may be performed to achieve an intended result is selectable by hardware, firmware, software, and/or an operator (e.g., user) to achieve the intended result (e.g., depth of an opening in an isolation trench, among other possibilities).

The figures herein follow a numbering convention in which the first digit or digits correspond to the figure number of the drawing and the remaining digits identify an element or component in the drawing. Similar elements or components between different figures may be identified by the use of similar digits. For example, 117 may reference element "17" in FIGS. 1A-1D and a similar element may be referenced as 217 in FIG. 2. In some instances, a plurality of similar, but functionally and/or structurally distinguishable, elements or components in the same figure or in different figures may be referenced sequentially with the same element number (e.g., 107-1 and 107-N in FIGS. 1A-1D).

FIGS. 1A-1D illustrate example cross-sectional views of isolation trenches at particular points in an example semiconductor structure fabrication sequence in accordance with a number of embodiments of the present disclosure. The fabrication sequence illustrated in FIGS. 1A-1D is shown at particular points in time that correspond to particular processing activities being performed in the fabrication process. Other processing activities included in a particular fabrication sequence may be omitted for ease of illustration.

FIG. 1A illustrates forming an opening 145-1, . . . , 145-N (collectively or individually referred to as a first opening 145) at (e.g., into) a working surface 109 in a semiconductor structure fabrication sequence. The working surface 109 and associated pillars 103-1, . . . , 103-N and isolation trenches 107-1, . . . , 107-N on a semiconductor substrate 124 are patterned at a point in time 100. In a number of embodiments, a location for the opening 145 may be patterned to form the isolation trenches 107-1, . . . , 107-N (collectively or individually referred to as isolation trench 107). The working surface 109 may be etched to form the opening 145. The etching may be performed according to a reactive ion etch (ME) process, or other suitable etching technique. As shown in FIG. 1A, a first dielectric material 117 may be deposited in the first opening 145. Depending on the context (e.g., in the claims), dielectric material 117 also may be referred to herein as a third dielectric material. In a number of embodiments, the dielectric material 117 may be an oxide deposited using a conformal deposition technique, such as a chemical vapor deposition (CVD) technique in a semiconductor processing apparatus (e.g., as shown and described in connection with FIG. 8). The oxide used for the dielectric material 117 may be a silicon oxide (SiOx), which not by way of limitation may be representative of $SiO_2$. As shown in FIG. 1A, a mask material 146 may, in a number of embodiments, be used to pattern an opening 110 formed between sidewalls 114 of the pillars 103-1, . . . , 103-N (collectively or individually referred to as pillar 103).

In a number of embodiments, the working surface 109 may be patterned using a photolithography technique. The mask material 146 may be a photosensitive material and portions of the mask material that are patterned may be hardened to form the boundaries of the isolation trenches 107.

As shown in the embodiment of FIG. 1A, the first dielectric material 117 may be deposited in the first opening 145. In some embodiments, the first dielectric material 117 may be formed from a low dielectric constant (k) material. The first dielectric material 117 may be conformally deposited in the isolation trench 107. In some embodiments, the first dielectric material 117 may be deposited to a thickness in a range of from around 1 nanometer (nm) to around 5 nm. In some embodiments, the first dielectric material 117 may be deposited to a thickness of around 3 nm. The openings 110 (collectively or individually referred to as a second opening 110) may, in a number of embodiments, be defined as being a volume within a surface 111 of the deposited first dielectric material 117.

Figure 1B:
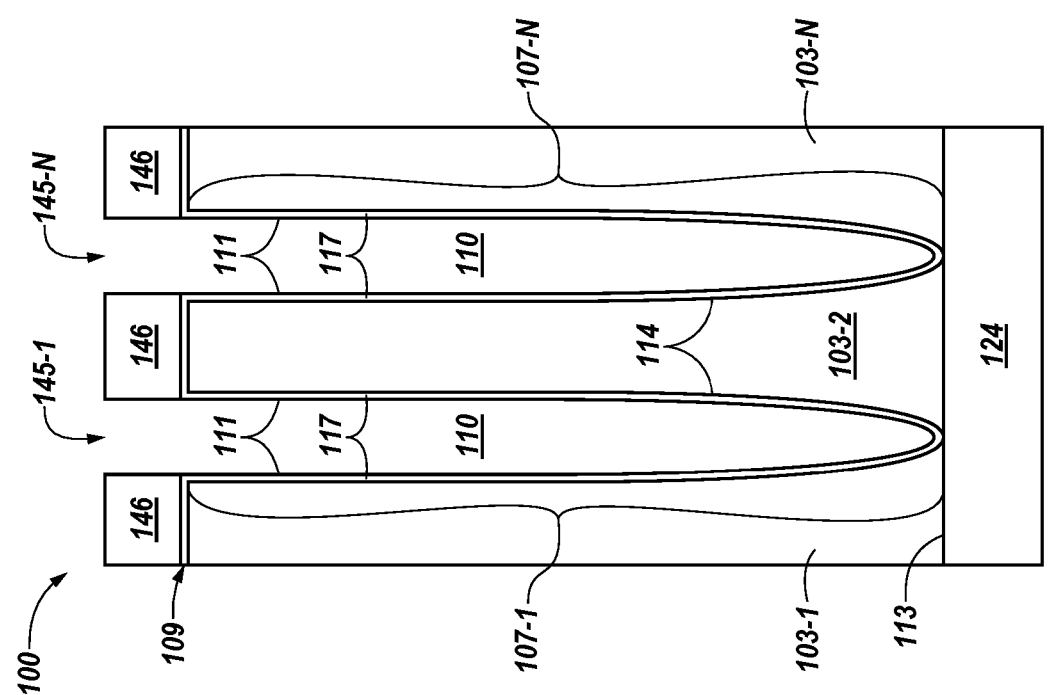

FIG. 1B illustrates a semiconductor structure during a semiconductor process at another point in time 115 in the fabrication sequence. A second dielectric material 108 may be deposited on the conformally deposited first dielectric material 117. In a number of embodiments, the second dielectric material 108 may be selected to have an opposing bias relative to a channel bias to an adjacent active area (e.g., active area 390 shown and described in connection with FIG. 3). The active area may be used in connection with (e.g., to connect with, control, etc.) a BRAD (e.g., as shown at 202 and 204 and described in connection with FIG. 2). The second dielectric material 108 may be formed (e.g., deposited) within the isolation trench 107 at the point in time 115 encompassed by FIG. 1B.

In a number of embodiments, a channel (e.g., as shown at 235 and described in connection with FIG. 2) may be a p-type channel to n-type access device and the second dielectric material 108 may be selected as an aluminum oxide (AlOx), which not by way of limitation may be representative of $Al_2O_3$. The second dielectric material 108 may be deposited using a conformal deposition. The second dielectric material 108 may be deposited to a particular thickness 119 at an intended depth, relative to the working surface 109, at a bottom portion (e.g., as shown at 141 and described in connection with FIG. 1C) of the second opening 110 of the isolation trenches 107. The second dielectric material 108 also may be deposited to a particular thickness 119 in a range of from around 1 nm to around 5 nm (e.g., 3 nm in some embodiments) from above the bottom portion on the surface 111 of the deposited first dielectric material 117 to a top of the isolation trenches 107. The top of the isolation trenches 107 at this point in time 115 may, in a number of embodiments, be at the working surface 109 or at an upper surface of the mask material 146 (e.g., on top of the pillars 103). The second dielectric material 108 also may be deposited over (e.g., on) the working surface 109 or the upper surface of the mask material 146. Openings 120 (collectively or individually referred to as a third opening 120) may be formed to a particular depth 121 relative to the working surface 109 above the bottom portion with a width determined by the particular thickness of the second dielectric material 108 deposited on the surface 111 of the deposited first dielectric material 117.

A third dielectric material 105 may be deposited into the isolation trench 107. Depending on the context (e.g., in the claims), dielectric material 105 also may be referred to herein as a first dielectric material. The dielectric material 105 may be deposited over the second dielectric material 108 to fill the openings 120. In a number of embodiments, the dielectric material 105 also may be deposited over the second dielectric material 108 on the working surface 109 or on the upper surface of the mask material 146. In a number of embodiments, the third dielectric material 105 may be formed from an oxide, a polymer, and/or a carbon-based material. For example, the third dielectric material 105 may be formed from SiOx, which not by way of limitation may be representative of $SiO_2$. Accordingly, the first dielectric material 117 and the third dielectric material 105 may, in a number of embodiments, both be formed from SiOx.

Figure 1C:
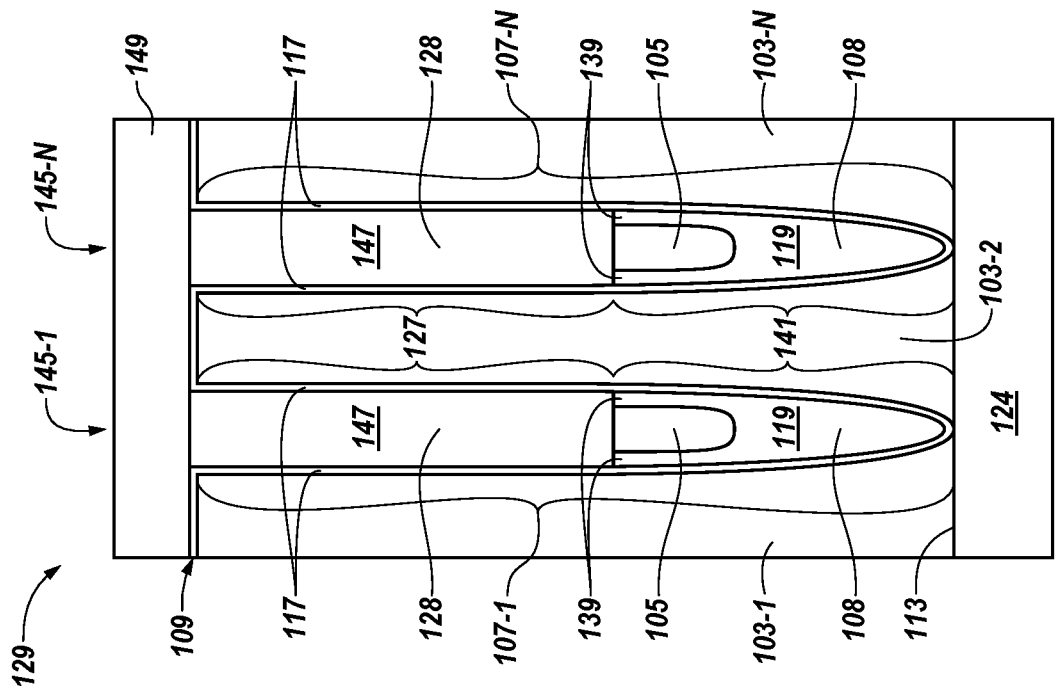

FIG. 1C illustrates a semiconductor structure during a semiconductor process at another point in time 125 in which the third dielectric material 105 is etched in the fabrication sequence. A dry etching technique may be performed to remove a portion of the third dielectric material 105 to recess the third dielectric material 105 that was deposited within the third opening 120 in the isolation trench 107. For example, a dry etch may be performed on the third dielectric material 105 to recess an upper surface 134 of the third dielectric material 105 to an intended depth of bottom portions 141 of the isolation trenches 107. Recessing the upper surface 134 of the third dielectric material 105 to the intended depth of the bottom portions 141 may form openings 123 (collectively or individually referred to as a fourth opening 123) to a particular depth 127 relative to the working surface 109 above the bottom portion 141. The fourth opening 123 may have a width determined by the particular thickness of the second dielectric material 108 deposited on the surface 111 of the deposited first dielectric material 117. The fourth opening 123 may have the second dielectric material 108 exposed, by performance of the vapor etch, on a sidewall (e.g., a sidewall 114 of the pillars 103 or the surface 111 of the deposited first dielectric material 117) of the opening.

In a number of embodiments, the dry etching technique may be a vapor etch that has a selectivity to the third dielectric material 105 (e.g., SiOx) relative to the second dielectric material 108 (e.g., AlOx) of from around two hundred (200) to one (1) (200:1) or greater. The vapor etching technique may, in a number of embodiments, be selected from using at least one of a hydrogen fluoride (HF), nitrogen trifluoride ($NF_3$), and/or ammonia ($NH_3$) as reactants during the vapor etch. The vapor etching technique may, in a number of embodiments, be performed in the presence or absence of plasma. Accordingly, the selectivity of the vapor etch to the third dielectric material 105 may leave an exposed surface of the second dielectric material on the sidewall of the fourth opening 123 substantially at an originally deposited thickness (e.g., from 1-5 nm thick).

Figure 1D:
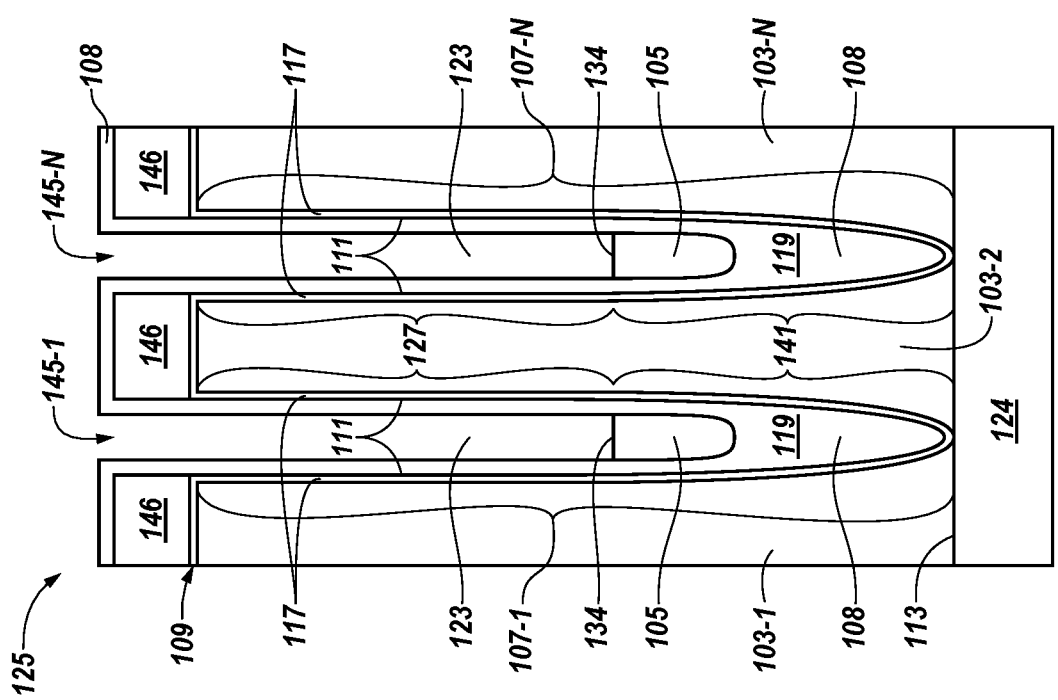

FIG. 1D illustrates a semiconductor structure during a semiconductor process at another point in time 129 in the fabrication sequence. In the example of FIG. 1D, a subsequent etch process has been performed. The embodiment of FIG. 1D further illustrates etching a portion of the second dielectric material 108 (e.g., AlOx) to remove the exposed second dielectric material 108 (e.g., AlOx) from sidewalls of the isolation trench 107 above the bottom portion 141 of the isolation trench. In a number of embodiments, the second dielectric material 108 may be recessed (e.g., etched) down to the intended depth to which the third dielectric material 105 was previously recessed. As such, an exposed upper surface 139 of the recessed second dielectric material 108 in the bottom portion 141 may be substantially at a same level (e.g., substantially coplanar) with the exposed upper surface 134 of the recessed third dielectric material 105 in the bottom portion 141 of the isolation trench 107.

The second dielectric material 108 may serve as a liner (e.g., a cup) for the third dielectric material 105 in the bottom portion 141. In a number of embodiments, a wet etching technique may be used to recess the exposed surface 139 of the second dielectric material 108 on the sidewall to the intended depth to serve as the liner at the bottom portion 141 of the isolation trench 107 subsequent to using a vapor etching technique to recess the exposed surface 134 of the third dielectric material 105 to the intended depth. The exposed surface 139 of the second dielectric material 108 being substantially coplanar with the exposed surface 134 of the third dielectric material 105 within the liner may serve to integrate the liner and the third dielectric material at the bottom portion 141 of the isolation trench 107. Proportions of the elements illustrated in FIGS. 1A-1D are shown for clarity and may not be to scale. As such, a height of the bottom portion 141 may, in a number of embodiments, be in a range of from around 1 nm to around 100 nm from the bottom of the isolation trench 107 (e.g., at substrate 124).

In a number of embodiments, the wet etching technique may be a wet etch that has a selectivity to the second dielectric material 108 (e.g., AlOx) relative to the third dielectric material 108 (e.g., SiOx) in a range of from around 15:1 to around 40:1. The wet etch may, in a number of embodiments, be selected from using at least one of deionized water ($H_2O$) and dilute hydrogen fluoride (HF) acid in deionized $H_2O$ (e.g., from around 50 to 2000 parts deionized $H_2O$ to 1 part HF acid) as reactants during the wet etch. The deionized $H_2O$, and any potential reactants therein, may be used at a high temperature (e.g., at a temperature of 35° C. or higher). Accordingly, the selectivity of the wet etch to the second dielectric material 108 may leave an exposed surface 134 of the third dielectric material 105 in the fourth opening 123 substantially at the originally intended depth. Removal of the second dielectric material 108 from a sidewall of the fourth opening 123 (e.g., above the bottom portion 141) may result in another opening 128 (collectively or individually referred to as a fifth opening 128) to a particular depth 127 relative to the working surface 109 above the bottom portion 141. Whereas the particular depth 127 of the fifth opening 128 may be the same as the particular depth 127 of the fourth opening 123, a width of the fifth opening 128 may be greater than a width of the fourth opening 123 due to removal of the second dielectric material 108 from the sidewall above the bottom portion 141.

The embodiment of FIG. 1D further illustrates that a fourth dielectric material 147 may be deposited through the first openings 145 to fill the fifth openings 128 in the isolation trenches 107. The fourth dielectric material 447 may be an oxide or a nitride determined to be suitable for isolation (e.g., of BRADs 202 and 204 described in connection with FIGS. 2 and 3). This may be followed by deposition of a cap 149 to the isolation trenches 107. The cap 149 may, in a number of embodiments, be a layer of silicon nitride (SiN), which not by way of limitation may be representative of $Si_3N_4$. The cap 149 may be planarized using chemical mechanical planarization (CMP), for example, to remove third dielectric material 105, second dielectric material 108, and/or mask material 146 remaining atop the pillars 103.

Figure 2:
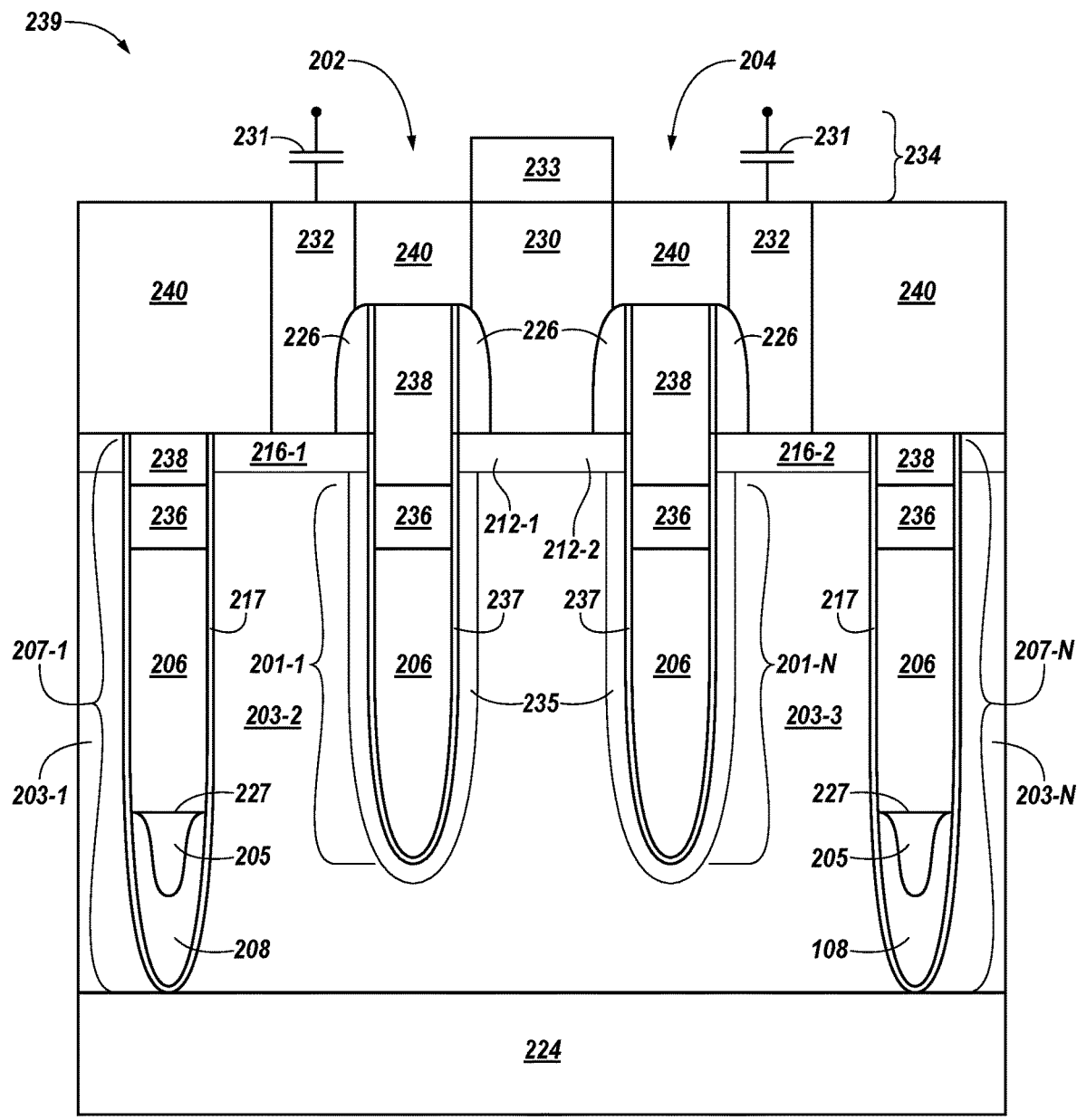
FIG. 2 illustrates an example cross-sectional view of a portion of a semiconductor device in accordance with a number of embodiments of the present disclosure.
Figure 9:
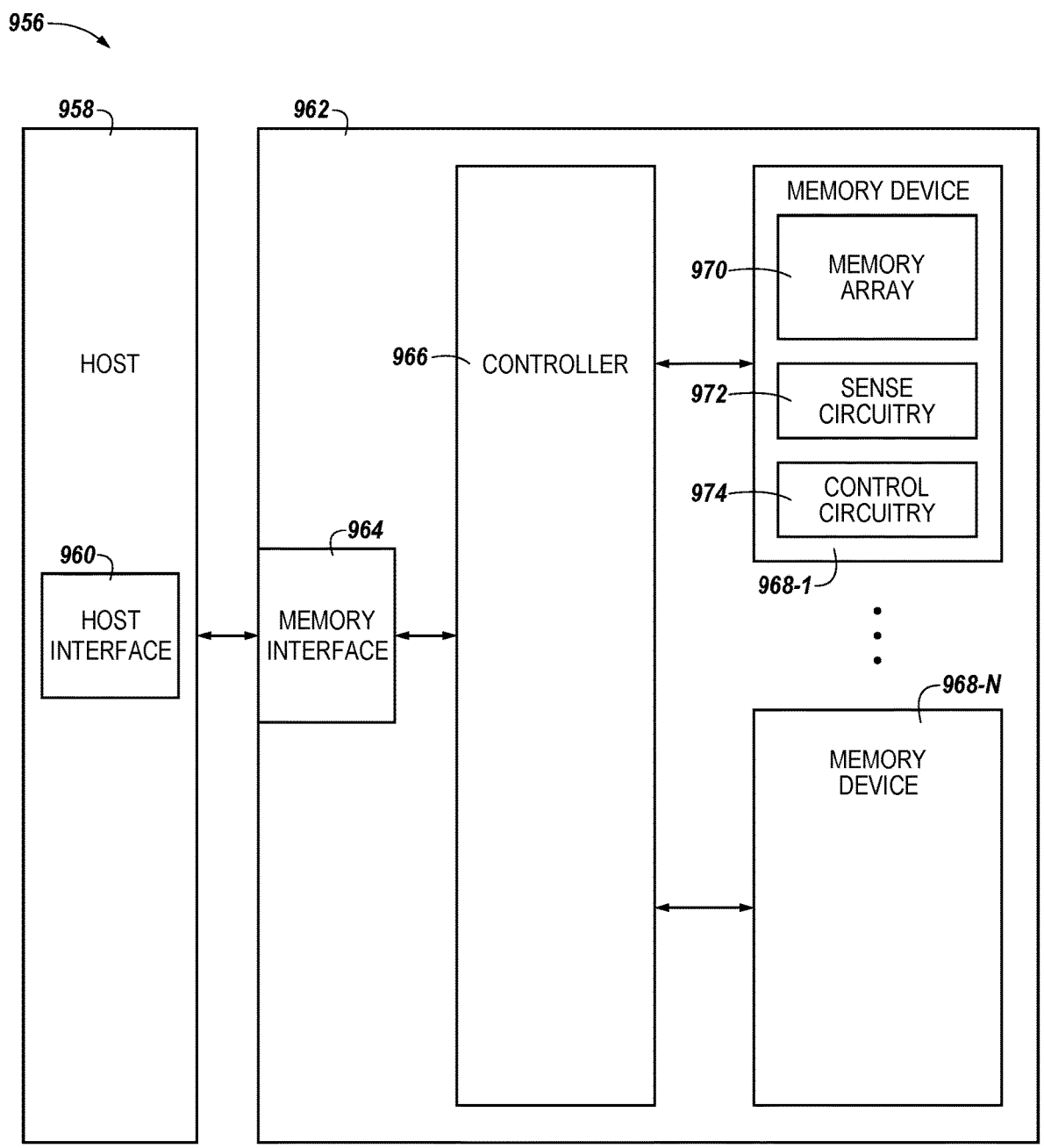
FIG. 9 is a functional block diagram of a computing system including at least one memory array having transistors formed in accordance with a number of embodiments of the present disclosure.

FIG. 2 illustrates an example cross-sectional view of a portion of a semiconductor device 239 in accordance with a number of embodiments of the present disclosure. FIG. 2 illustrates neighboring access devices 202 and 204 (e.g., memory cell transistors), as may be present in a memory array of a memory device such as shown in FIG. 9. In the example embodiment of FIG. 2, the neighboring access devices 202 and 204 are shown as BRADs. Embodiments, however, are not limited to this example. Isolation trenches 207-1, . . . , 207-N (collectively or individually referred to as isolation trench 207) may be used to separate neighboring access devices from other access devices according to a particular array layout. FIG. 2 illustrates a pair of isolation trenches 207 in one such architecture in accordance with an embodiment of the present disclosure. In semiconductor device 239, an isolation trench 207 may be used to prevent electric current leakage between adjacent semiconductor device components. Isolation trenches 207 may be formed by etching a pattern of the isolation trenches 207 between pillars 203-1, . . . , 203-N and/or into substrate material 224 and depositing dielectric materials (e.g., 217, 208, and 205)

into the isolation trench 207. In a semiconductor fabrication process, other trenches may be formed and a gate dielectric 237 and semiconductor materials may be deposited to form access device gates 206 and 236 (collectively or individually referred to as gate 206) according to a particular BRAD design process. Gate 206 may also be referred to as a passing access line. Embodiments are not limited to the example shown. In this example of neighboring BRAD devices 202 and 204, isolation trench 207 may be formed to a greater depth than a depth of a gate area 201-1, . . . , 201-N of the BRAD devices 202 and 204. The isolation trench 207 may have an aspect ratio (AR) of a height divided by width of 15:1 or greater.

In one embodiment, a first dielectric material 217 may be deposited into the isolation trench 207. The first dielectric material 217 may be deposited to a thickness in a range of 1-5 nm. The first dielectric material 217 may be an initial barrier between the pillars 203 and/or the substrate material 224 and the other neighboring semiconductor devices and/or components. In one example embodiment, a second dielectric material 208 may be deposited into the isolation trench 207. The second dielectric material 208 may have a conductive bias that opposes the conductive bias of a channel region 235 of an active area for the respective BRAD devices 202 and 204. In some embodiments, the second dielectric material 208 with a conductive bias opposing the conductive bias of an active area may be AlOx. Depositing the second dielectric material 208 into the isolation trench 207 may allow a Vt of the BRAD devices 202 and 204 to be independently controlled electrostatically at the bottom of a channel 235. As described in connection with FIG. 1C, a third dielectric material 205 may be formed within a liner of the second dielectric material 208 at an intended depth 227 in the isolation trench 207.

Depositing the second dielectric material 208 may reduce or eliminate an amount of dopant (e.g., boron) used in a channel 235 to maintain particular conductive properties of the BRAD devices 202 and 204. As previously mentioned, doping a channel 235, may result in diffusion and the dopant spreading to other unintended areas. Diffusion is a process in which dopants introduced into a substrate material spread into other areas. Since in diffusion a dopant may spread to other areas, the dopant may undesirably change the conductive properties of other materials in a manner that was not intended. Depositing the second dielectric material 208 with a fixed charge opposing the doping type of the channel 235 into the isolation trench 207 may reduce the risk associated with doping a channel region 235 of the BRAD devices 202 and 204. In the example of a p-type channel 235 BRAD device 202 and 204, AlOx may be deposited into the isolation trench 207. This solution may also decrease gate induced drain leakage (GIDL) occurrence by reducing or avoiding the use of boron in the channel 235 and, as a result, decreasing the likelihood of the boron dopant in a channel region 235 spreading to other areas.

A passing access line (e.g., a word line) 206 also may be deposited into the isolation trench 207. The passing access line 206 may, in a number of embodiments, be in, over, or under the fourth dielectric material 147 described in connection with FIG. 1D. In some embodiments, passing access line 206 may be a metal. The passing access line 206 may be deposited over the second dielectric material 208 having a conductive bias opposing the conductive bias of the channel 235. In some embodiments, the passing access line 206 may be deposited to fill the remaining portion of the isolation trench 207 (e.g., instead of the fourth dielectric material 147).

The depth of the isolation trench 207 may be deeper than the depth of a trench 201-1, . . . , 201-N used to form an active area of the access line (e.g., a word line (gate) 206 and 236). The isolation trench 207 may, in a number of embodiments, be formed to have a width of fifteen (15) nm or less, a height of two hundred (200) nm or greater, and an AR of fifteen to one (15:1) or greater. The second dielectric material 108 with the conductive bias opposing the conductive bias of an active area may be deposited to height that is above a portion of a bottom surface of the neighboring gate 206 to access devices 202 and 204. For example, the second dielectric material 208 may be deposited to height that is ten percent (10%) to twenty percent (20%) of the depth of a gate 206 starting from the bottom of the gate 206 to access devices 202 and 204. However, embodiments are not so limited and other ranges may be used for particular applications or design rules.

As shown in FIG. 2, the gates 206 are also formed for the access devices 202 and 204. As shown, the gate 206 may be a gate to a BRAD. In the example shown, the gate 206 may include a gate material 206 including a metal (e.g., titanium nitride (TiN)), and a gate material 236 including a doped polysilicon to form a hybrid metal gate (HMG). The gate 206 may be separated from a channel 235, separating a first source/drain region 216-1 and 216-2 (collectively or individually referred to as first source/drain region 216) and a second source/drain region 212-1 and 212-2 (collectively or individually referred to as second source/drain region 212) by a gate dielectric 237.

In the example of FIG. 2, two neighboring access devices 202 and 204 are shown sharing a second source/drain region 212 at a junction. A sense line contact 230 may be formed of a metallic material, or other conductive contact. The sense line contact 230 may be formed in contact with the second source/drain region 212, and the junction. A sense line 233 (e.g., digit line or bit line) may be formed in contact with the sense line contact 230. A storage node contact 232 may be coupled to each first source/drain region 216 and a storage node 231 may be coupled to the storage node contact 232. An insulation material 240 (e.g., a dielectric material) may be formed on spacer material and mask material 226 and 238 to separate conductive contacts 232.

In a number of embodiments, a portion of the sense line contact 230 may be formed in contact with spacer material 226, the second source/drain regions 212, and the junction. Insulation material 240 may be formed on the spacer material 226, the mask material 238, and in contact with a portion of the sense line contact 230 and storage node contacts 232. A gate dielectric 237 may separate the gate 206 from the channel 235 for each of the neighboring BRAD devices 202 and 204 shown in the example of FIG. 2.

Figure 3:
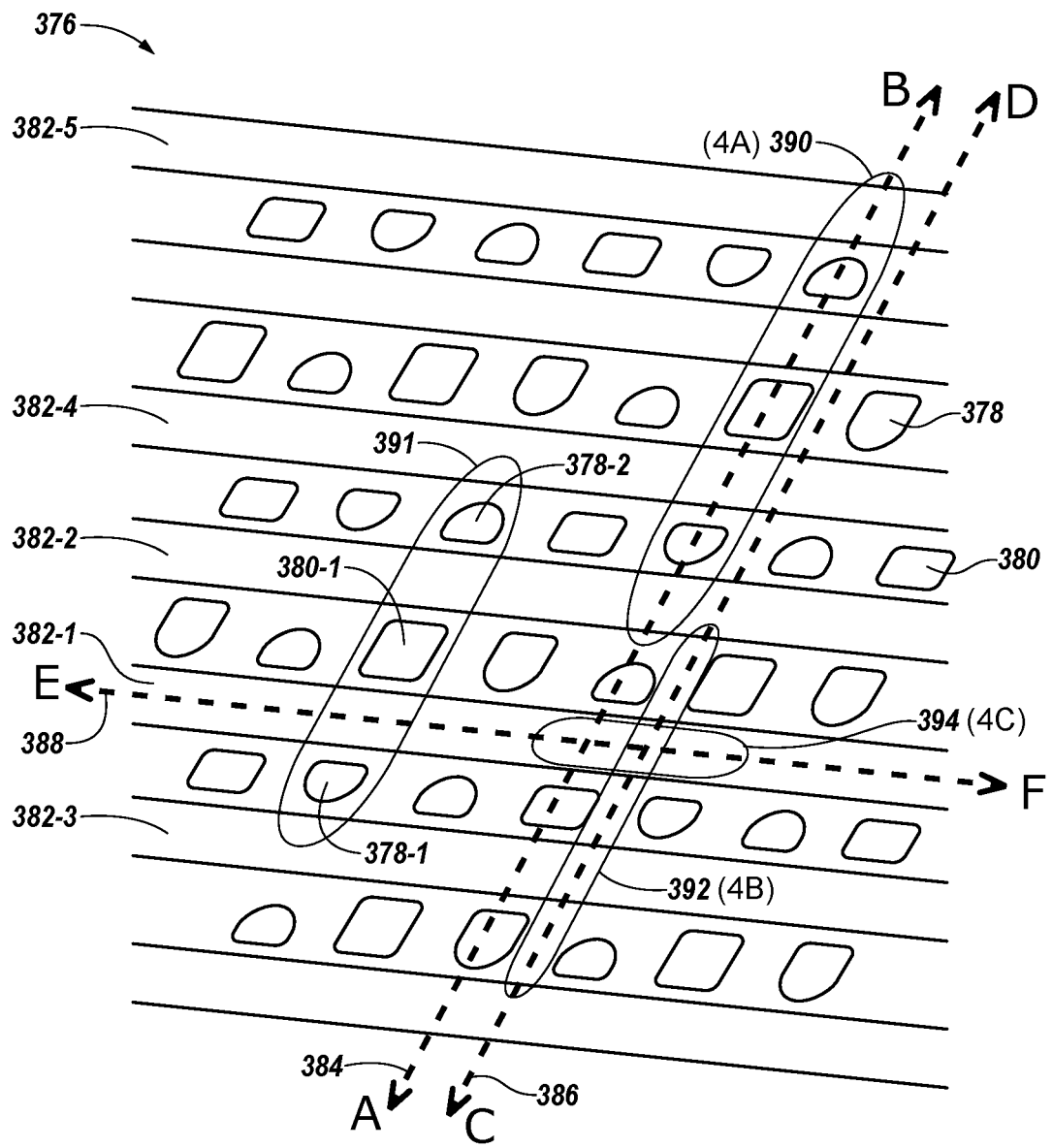
FIG. 3 illustrates an example top-down view of a memory array structure in accordance with a number of embodiments of the present disclosure.

FIG. 3 illustrates an example of a top-down view of a memory array structure 376 in accordance with a number of embodiments of the present disclosure. FIG. 3 illustrates a number of active area regions (e.g., 390 and 391), first source/drain regions 378, and second source/drain regions 380. Area 391 encompasses a pair of access devices sharing a second source/drain region 380-1 that may be connected to a sense line and a pair of first source/drain regions 378-1 and 378-2. The second source/drain region 380-1 and the first source/drain region 378-1 may be separated by a channel and an access line 382-1. Adjacent the example active areas 391 and 390 on either side may be located a number of passing access lines 382-3 and 382-4 to other active areas.

Figure 4A:
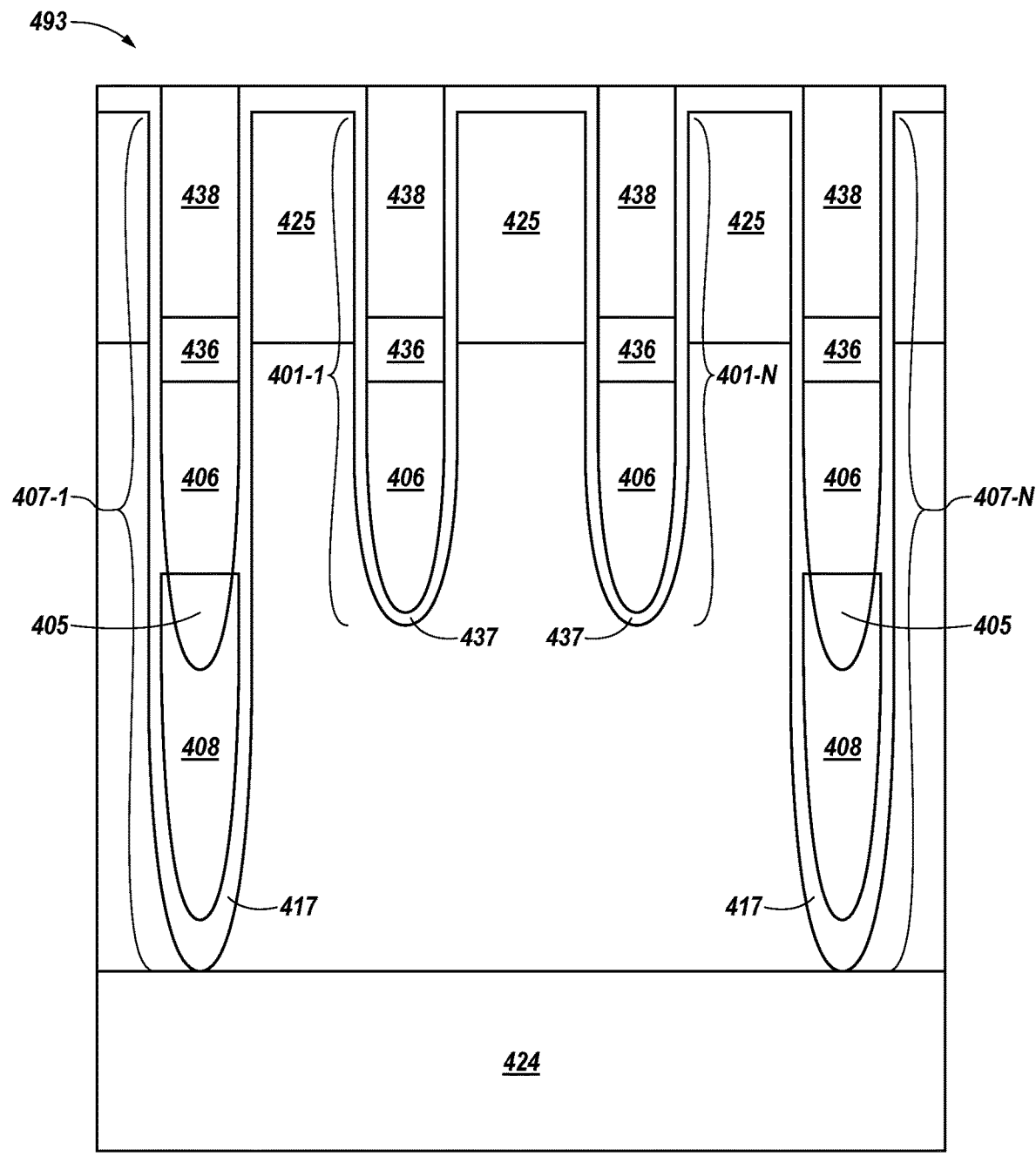
FIGS. 4A-4C illustrate example cross-sectional views of a memory array structure at different locations within a substrate in a semiconductor structure fabrication process in accordance with a number of embodiments.

In the example of FIG. 3, area 390 encompasses an active area of neighboring access devices and neighboring, passing access lines 382-2 and 382-5. A cross-sectional view taken along cut line A-B 384 is shown in FIG. 4A. The passing access lines 382-2 and 382-5 in area 390, may be formed in isolation trenches (e.g. isolation trenches 107 in FIGS. 1 and 207 in FIG. 2). The isolation trenches may include AlOx with a conductive bias opposite the conductive bias of an adjacent channel (e.g. channel 235 in FIG. 2). The AlOx may be used to electrostatically control a Vt of the channel.

Area 391 illustrates a pair of access devices sharing a source/drain region. Semiconductor structures formed according to the top-down view of an example memory array layout may include access devices (e.g., transistors) and storage nodes (e.g., capacitor cells), etc. A dynamic random access memory (DRAM) array is one form of example memory array that may be formed from semiconductor structures fabricated through a semiconductor fabrication process performed on a substrate of a semiconductor wafer. A memory array may have an of array of access devices and storage nodes forming memory cells at the intersection of rows and columns.

Figure 4B:
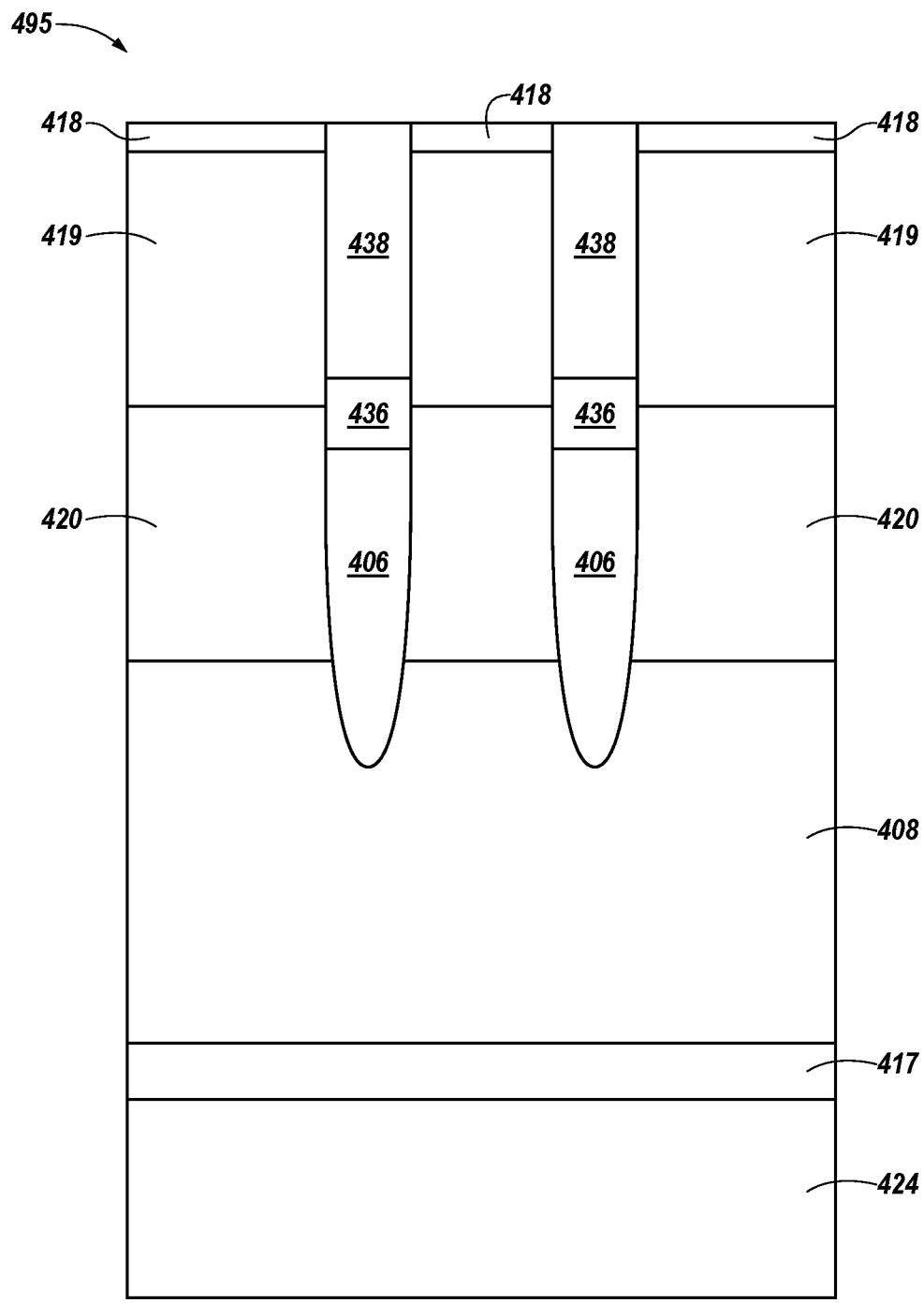

Area 392 illustrates an isolation area between columns of sense lines to access devices taken along cut line C-D 386. A cross section along cut-line C-D 386 is shown in FIG. 4B. The isolation area may be formed by depositing a dielectric material between adjacent active area regions (e.g., 391 and 390). The dielectric material in the isolation area may decrease the likelihood of semiconductor structures formed adjacent the active area region 391 and 390 communicating (e.g. disturbing one another) in a manner that is not intended. Area 392 may also encompass portions of passing access lines 382-2.

Figure 4C:
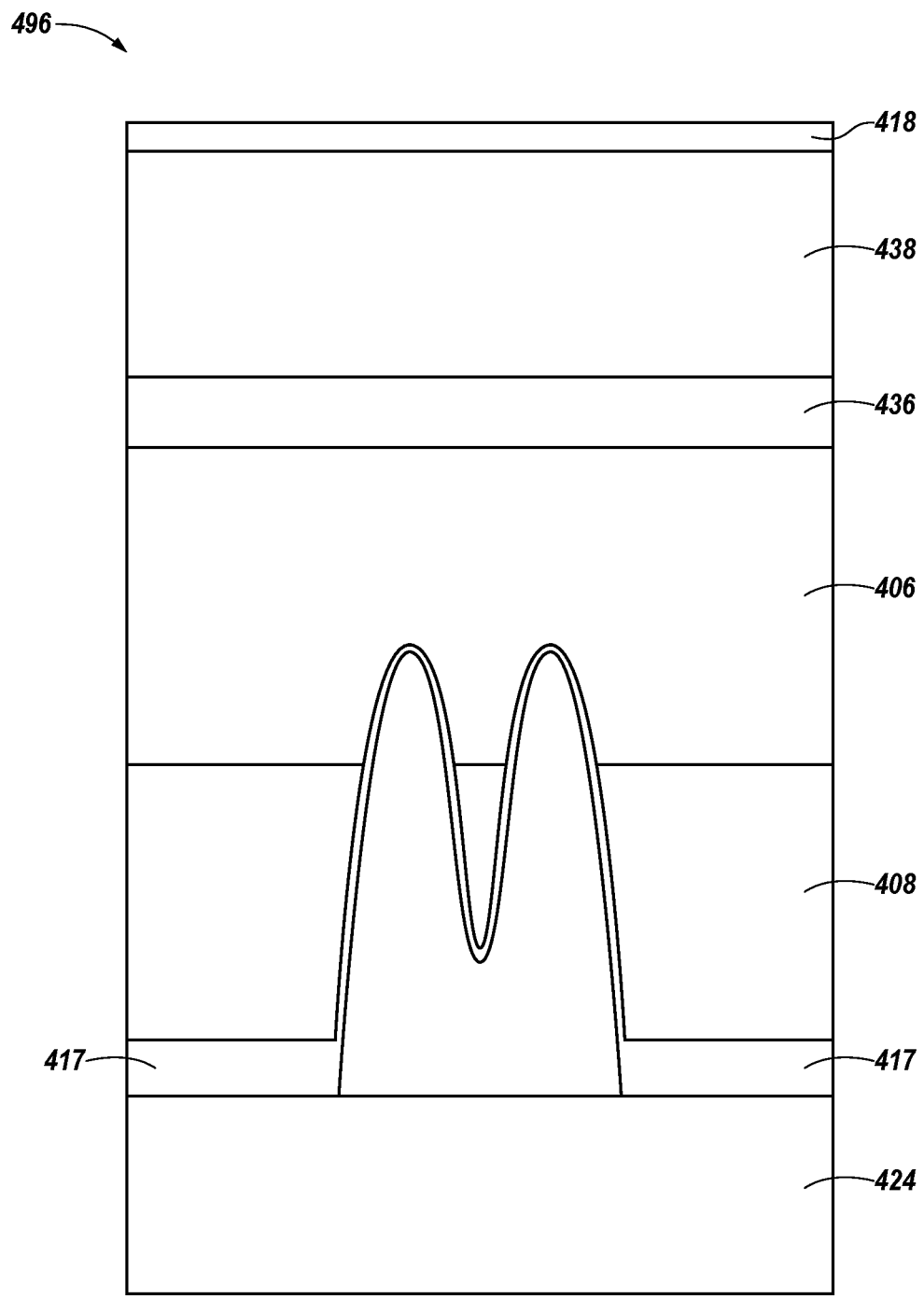

Area 394 illustrates a portion of an access line 382-1 along cut-line E-F 388. A cross section along cut-line E-F 388 is shown in FIG. 4C. The access line 382-1 may serve as a gate to adjacent to active areas. An access line (e.g., word line) may be used to activate an access device (e.g., access transistor) to access (e.g., turn "on" or "off" access) to the storage node (e.g., capacitor cell) of a memory cell. A sense line (e.g., bit line) may be used to read and/or program (e.g., write, refresh, erase, etc.) to and/or from a storage node of the memory cells.

FIGS. 4A-4C illustrate example cross-sectional views of a memory array structure at different locations within a substrate in a semiconductor structure fabrication process in accordance with a number of embodiments. The cross-sectional views of FIGS. 4A-4C correspond to cut lines A-B, C-D, and E-F shown in FIG. 3.

FIG. 4A illustrates a cross-sectional view of the memory array structure taken along cut-line A-B, and encompassed by active area region 390 as shown in FIG. 3 at particular point in time 493 in a semiconductor structure fabrication process. FIG. 4A illustrates isolation trenches 407-1, . . . , 407-N (collectively or individually referred to as isolation trench 407) and gates 436 and 406 (collectively or individually referred to as gate 406) formed to a depth of 401-1, . . . , 401-N into a working surface over a substrate material 424. FIG. 4A also illustrates a gate dielectric 437 deposited in the gate 406.

Isolation trench 407 may include a first dielectric material 417, a second dielectric material 408, a third dielectric material 405, passing access line conductive materials 406 and 436, an insulator fill 438. In various embodiments, the second dielectric material 408 has a high k (e.g., AlOx) relative to the first dielectric material 417 and/or the third dielectric material 405 (e.g., SiOx). However, embodiments are not so limited and the dielectric material may have a k in a range of from 1 to 50.

FIG. 4B illustrates a cross-sectional view of the memory array structure taken along cut-line C-D, and encompassed by active area region 392 as shown in FIG. 3 at a particular point in time 495 in a semiconductor structure fabrication process. FIG. 4B illustrates isolation trenches 407. Isolation trench 407 may include a first dielectric material 417, a second dielectric material 408, passing access line conductive material 406 and 436, and an insulator fill material 438. FIG. 4B may also include a substrate 424 and dielectric materials 418, 419, 420.

FIG. 4C illustrates a cross-sectional view of the memory array structure, taken along cut-line E-F, and encompassed by active area 394 as shown in FIG. 3 at a particular point in time 496 in a semiconductor structure fabrication process. FIG. 4C illustrates a substrate material 424, dielectric materials 408 and 417, passing access line conductive material 406 and 436, and a mask material 438.

Figure 5:
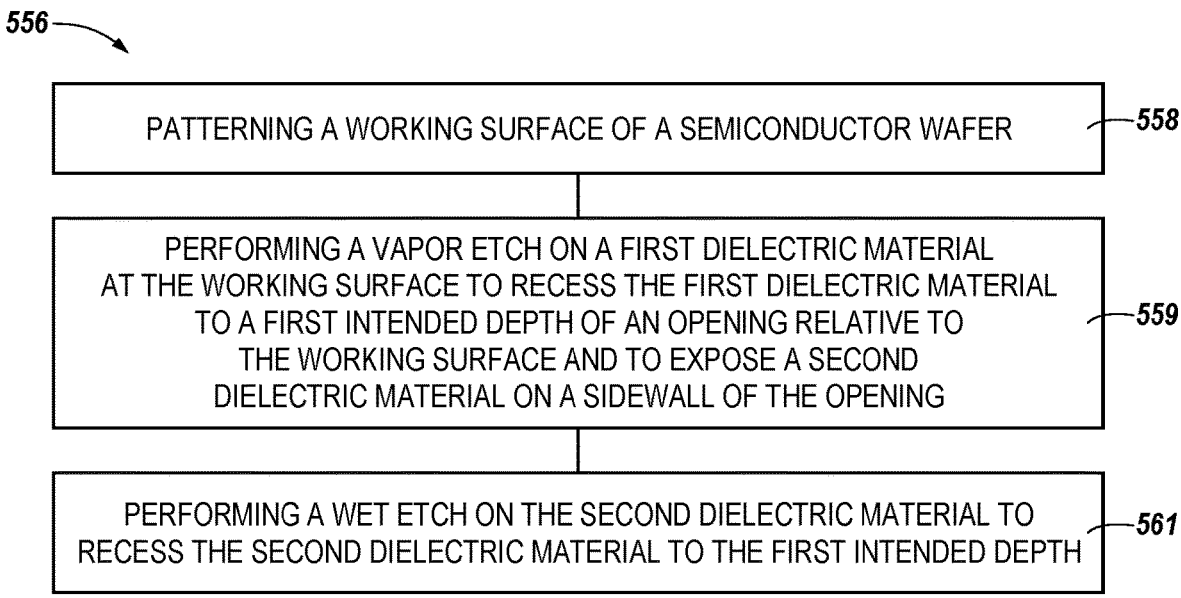
FIGS. 5-7 are flow diagrams of example methods for semiconductor structure formation in accordance with a number of embodiments of the present disclosure.

FIG. 5 is a flow diagram of an example method 556 for semiconductor structure formation in accordance with a number of embodiments of the present disclosure. Unless explicitly stated, elements of methods described herein are not constrained to a particular order or sequence. Additionally, a number of the method embodiments, or elements thereof, described herein may be performed at the same, or at substantially the same, point in time.

At block 558, the method 556 may include patterning a working surface of a semiconductor wafer (e.g., as described with regard to the structural features and fabrication sequence in connection with FIGS. 1A-1D). At block 559, the method 556 may include performing a vapor etch on a first dielectric material at the working surface to recess the first dielectric material to a first intended depth of an opening relative to the working surface and to expose a second dielectric material on a sidewall of the opening (e.g., as described with regard to the structural features and fabrication sequence in connection with FIG. 1C). At block 561, the method 556 may include performing a wet etch on the second dielectric material to recess the second dielectric material to the first intended depth (e.g., as described with regard to the structural features and fabrication sequence in connection with FIG. 1D).

The intended depth may, in a number of embodiments, be at height (e.g., represented at 134 and 139 at a top of the bottom portion shown at 141 and described in connection with FIGS. 1C and 1D) in a range of from around 1 nm to around 50 nm above the bottom of a trench. For example, a bottom of the trench may be at substrate 124 at the bottom of isolation trench 107 shown in FIG. 1A, although embodiments are not so limited.

The method 556 may, in a number of embodiments, further include repeating the just-described elements (e.g., sequence) of the fabrication process in a number of cycles to recess the opening to a second intended depth that is deeper relative to the working surface. For example, a first performance of the just-described sequence of the fabrication process may not achieve the intended depth due to limitations, in a number of embodiments, of the vapor and/or wet etching techniques performed on the first and/or second dielectric materials imposed by a width of the opening, a depth of the opening, an AR of the opening, and/or how far below the working surface the intended depth is, among other possible limitations. Hence, the just-described sequence of the fabrication process may be repeated in various numbers of cycles (e.g., iterations) until the intended depth is reached. The number of cycles performed to reach the first intended depth and/or the second intended depth may be tunable (e.g., selectable by hardware, firmware, software, and/or an operator).

The method 556 may, in a number of embodiments, further include using SiOx as the first dielectric material and using AlOx as the second dielectric material (e.g., as shown at 105 and 108 respectively, and described with regard to the structural features and fabrication sequence in connection with FIGS. 1B-1D). The method 556 may further include using at least one of HF, $NF_3$, and $NH_3$ as reactants during the vapor etch on the first dielectric material. Such a vapor etch may be selective to the first dielectric material relative to the second dielectric material. The method 556 may further include using at least one of deionized water $H_2O$ and dilute HF acid in deionized $H_2O$ (e.g., from around 50 to 2000 parts deionized $H_2O$ to 1 part HF acid at a temperature of 35° C. or higher) as reactants during the wet etch. Such a wet etch may be selective to the second dielectric material relative to the first dielectric material.

The method 556 may further include performing the vapor etch at a pressure of less than 0.15 Torr (T) and at a temperature of less than 40 degrees Celsius (° C.). Alternatively, the method 556 may further include performing the vapor etch at a pressure of 0.2 T or higher and at a temperature of 40° C. or higher. The higher pressure, higher temperature vapor etch may be performed on the dielectric material to reduce a probability of (e.g., prevent) toppling of materials (e.g., a doped Si semiconductor) used to form the pillars 103 and/or materials used to form the isolation trenches 107 (e.g., SiOx and/or AlOx dielectrics). As used herein, "toppling" may refer to etching of semiconductor and/or dielectric materials contributing to twisting, bending, and/or falling over of the structures formed therefrom. This higher pressure, higher temperature vapor etch may reduce the probability of toppling due to causing sublimation of the byproducts of the vapor etch enabling removal thereof rather than redeposition of the byproducts (e.g., near a top of a pillar 103 and/or on a working surface 109). Reducing the toppling of the structures may allow for etching and/or deposition of dielectric materials in the isolation trenches and/or contribute to functionality of the isolation trenches and associated access devices in an intermediate or final structure (e.g., as shown in FIGS. 2 and/or 9).

Figure 6:
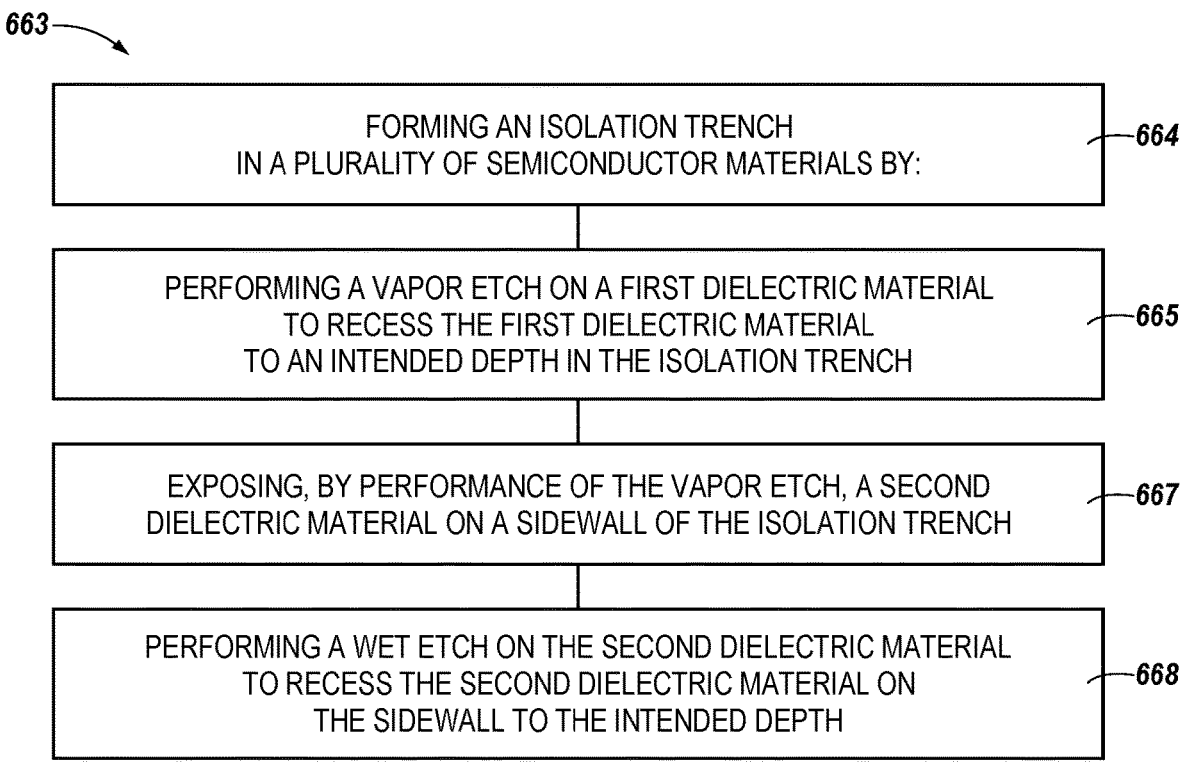

FIG. 6 is a flow diagram of an example method 663 for fabricating isolation trenches in accordance with a number of embodiments of the present disclosure.

At block 664, the method 663 may include forming an isolation trench in a plurality of semiconductor materials by using a number of elements in fabrication sequence described as follows. At block 665, the method 663 may include performing a vapor etch on a first dielectric material (e.g., SiOx) to recess the first dielectric material to an intended depth in the isolation trench (e.g., as described with regard to the structural features and fabrication sequence in connection with FIG. 1C). At block 667, the method 663 may include exposing, by performance of the vapor etch, a second dielectric material (e.g., AlOx) on a sidewall of the isolation trench (e.g., as described with regard to the structural features and fabrication sequence in connection with FIG. 1C). At block 668, the method 663 may include performing a wet etch on the second dielectric material to recess the second dielectric material on the sidewall to the intended depth (e.g., as described with regard to the structural features and fabrication sequence in connection with FIG. 1D).

The method 663 may, in a number of embodiments, further include conformally depositing, prior to performance of the vapor etch, AlOx as the second dielectric material on the sidewall (e.g., as described with regard to the structural features and fabrication sequence in connection with FIG. 1B). The method 663 may further include depositing, prior to performance of the vapor etch, the second dielectric material using an atomic layer deposition (ALD) process. The method 663 may further include depositing the second dielectric material to a thickness in a range of from around 1 nm to around 5 nm. The method 663 may further include forming, prior to performance of the vapor etch, an opening in the second dielectric material on a surface of a substrate and between sidewalls of a pair of adjacent pillars and depositing the first dielectric material to substantially fill the opening in the second dielectric material (e.g., as described with regard to the structural features and fabrication sequence in connection with FIG. 1B).

The method 663 may further include forming, prior to performance of the vapor etch, a third dielectric material (e.g., as shown at 117) on a surface of a substrate and on sidewalls of a pair of adjacent pillars to form an opening (e.g., as shown at 110) therebetween (e.g., as described with regard to the structural features and fabrication sequence in connection with FIG. 1A). The third dielectric material 117 is referred to as a first dielectric material in connection with the fabrication sequence previously described with regard to FIGS. 1A-1D. The third dielectric material may be formed to a thickness in a range of from around 1 nm to around 5 nm. The second dielectric material may be formed on a surface (e.g., as shown at 111) of the opening.

The method 663 may, in a number of embodiments, further include using SiOx for the first dielectric material, using AlOx for the second dielectric material, using SiOx for the third dielectric material, using at least one of silicon (Si), poly-Si, amorphous Si, and doped Si for the pillars, and using at least one of Si, poly-Si, and amorphous Si for the substrate. The method 663 may, in a number of embodiments, further include using a low k material as the first dielectric material and/or the third dielectric material and using a high k material, relative to the first and third dielectric materials, as the second dielectric material.

Figure 7:
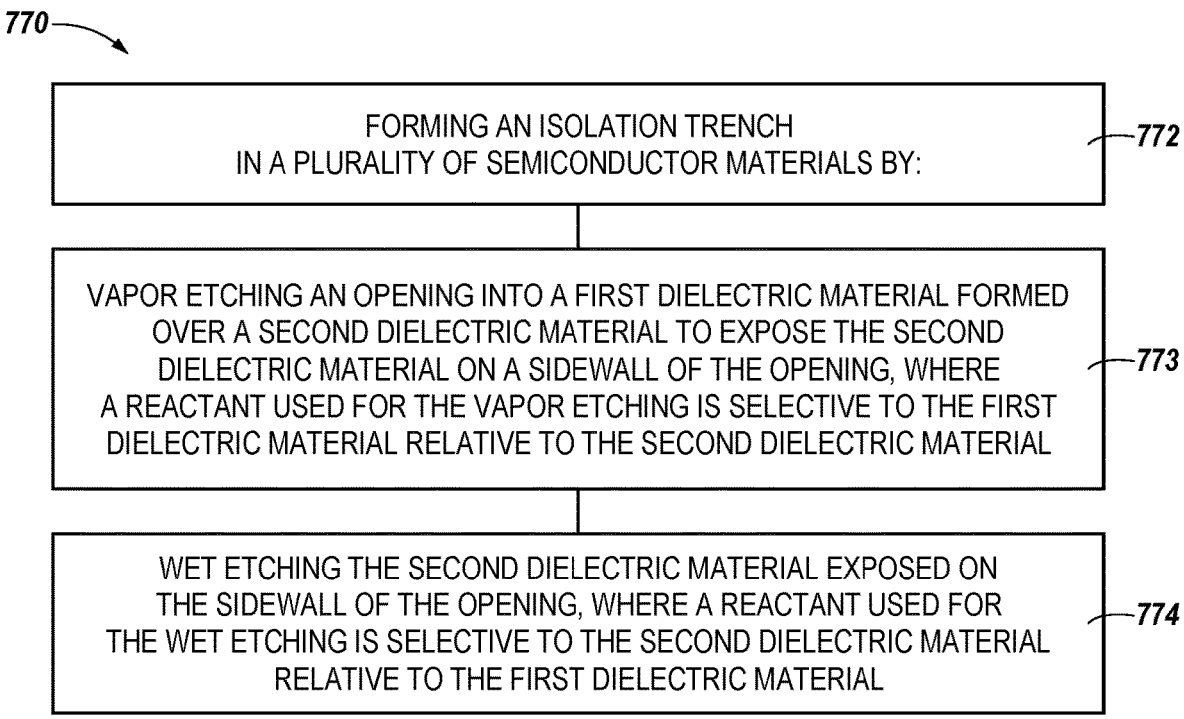

FIG. 7 is another flow diagram of an example method 770 for fabricating isolation trenches in accordance with a number of embodiments of the present disclosure.

At block 772, the method 770 may include forming an isolation trench in a plurality of semiconductor materials by using a number of elements in fabrication sequence described as follows. At block 773, the method 770 may include vapor etching an opening into a first dielectric material formed over a second dielectric material to expose the second dielectric material on a sidewall of the opening, where a reactant used for the vapor etching may be selective to the first dielectric material relative to the second dielectric material (e.g., as described with regard to the structural features and fabrication sequence in connection with FIG. 1C). At block 773, the method 770 may include wet etching the second dielectric material exposed on the sidewall of the opening, where a reactant used for the wet etching may be selective to the second dielectric material relative to the first dielectric material (e.g., as described with regard to the structural features and fabrication sequence in connection with FIG. 1D).

In a number of embodiments, the vapor etching may be used to recess the opening in the first dielectric material to an intended depth (e.g., as shown at 134 in FIG. 1C) relative to a working surface of the plurality of semiconductor materials and the wet etching may be used to recess the exposed second dielectric material on the sidewall of the opening to the intended depth (e.g., as shown at 139 in FIG.

1D). Selectivity of the wet etching to the exposed second dielectric material may leave an exposed surface of the first dielectric material substantially at the intended depth.

The method 770 may, in a number of embodiments, further include the vapor etching leaving an exposed surface of the second dielectric material on the sidewall of the opening substantially at a deposited thickness based on the vapor etching being selective to the first dielectric material. For example, the vapor etching may not notably etch away a thickness of the AlOx originally deposited on the sidewall (e.g., as shown at 111 and/or 114 in FIG. 1A). The method 770 may further include the wet etching leaving an exposed surface of the second dielectric material and the exposed surface of the first dielectric material substantially at an intended depth in the isolation trench (e.g., as shown at 134 and 139).

The method 770 may further include forming the plurality of semiconductor materials over a substrate structure that may include a plurality of pillars 103 (e.g., a pair of adjacent pillars shown at 103-1 and 103-2 formed on a substrate 124 in FIGS. 1A-1D). In a number of embodiments, the pillars 103 may be formed by etching into a substrate material and/or by positioning (fastening, implanting, connecting, etc.) preformed pillars on the substrate. The method 770 may further include forming the isolation trench between the pair of adjacent pillars (e.g., as described with regard to the structural features and fabrication sequence in connection with FIGS. 1A-1D).

The method 770 may further include recessing to the intended depth, by the wet etching, an exposed surface of the second dielectric material on the sidewall to serve as a liner at a bottom portion of the isolation trench (e.g., as described with regard to the structural features and fabrication sequence in connection with FIG. 1D). The method 770 may further include recessing to the intended depth, by the vapor etching, an exposed surface of the first dielectric material within the liner to integrate the liner and the first dielectric material at the bottom portion of the isolation trench.

The method 770 may further include forming the second dielectric material to have an opposing bias relative to a channel bias to an adjacent active area of a BRAD associated with a pair of adjacent pillars (e.g., as described with regard to the structural features and fabrication sequence in connection with FIGS. 2 and 3). The second dielectric material being recessed to the bottom portion of the isolation trench may enable electrostatic control of a Vt of the channel. Hence, in a number of embodiments, AlOx may be the second dielectric material deposited in the bottom portion of the isolation trench to enable electrostatic control of the Vt of the channel.

Figure 8:
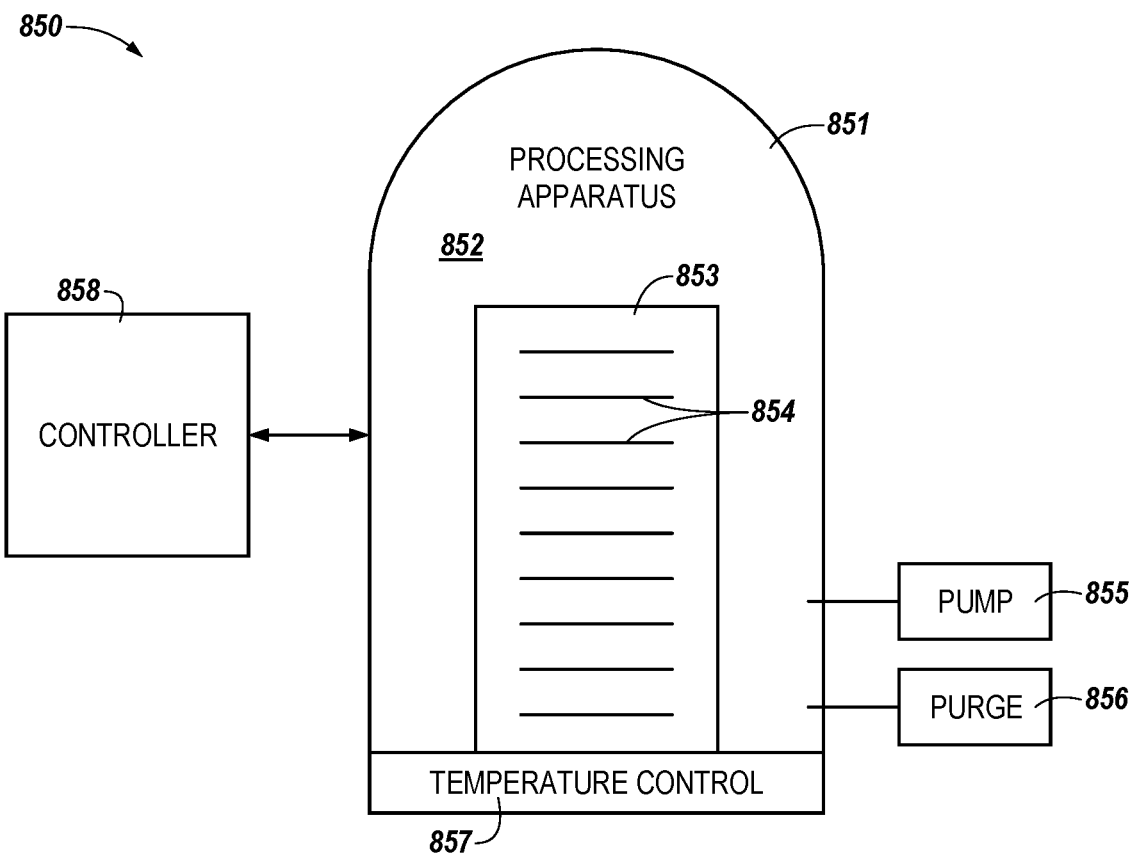
FIG. 8 is a functional block diagram of a system for implementation of an example semiconductor structure fabrication process in accordance with a number of embodiments of the present disclosure.

FIG. 8 is a functional block diagram of a system 850 for implementation of an example semiconductor structure fabrication process in accordance with a number of embodiments of the present disclosure. The numbering convention used in connection with FIG. 8 does not follow the earlier introduced numbering convention and sequence that applies to FIGS. 1-7. The system 850 may include a processing apparatus 851. The processing apparatus 851 may be configured to enable formation of structural materials on and/or removal of structural materials from a semiconductor device during fabrication of the semiconductor device.

FIG. 8 illustrates an example processing apparatus 851 that may be used in a semiconductor fabrication process. The processing apparatus 851 may include a chamber 852 to enclose components configured to perform deposition and/or etch operations on a number of semiconductor devices. The chamber 852 may further enclose a carrier 853 to hold a batch of semiconductor wafers 854. The processing apparatus 851 may include and/or be associated with tools including, for example, a pump 855 unit and a purge 856 unit configured to introduce and remove appropriate etch chemistries, as described herein, at each point in the semiconductor fabrication sequence. The processing apparatus 851 may further include a temperature control 857 unit configured to maintain the chamber 852 at an appropriate temperature at each of the points in the fabrication sequence. The system 850 may include a number of chambers 852 that are each configured to perform particular processes (e.g., a wet etch process, a dry etch process, and/or a deposition process, among others) during the fabrication sequence.

The system 850 may further include a controller 858. The controller 858 may include, or be associated with, circuitry and/or programming for implementation of, for instance, forming a dielectric material in a trench to a passing access line. The dielectric material has a bias opposing a conductivity of a channel region to a neighboring access device. Adjustment of such deposition, removal, and etching operations by the controller 858 may control the critical dimensions (CDs) of the semiconductor devices created in the processing apparatus 851.

A host may be configured to generate instructions related to semiconductor structure formation (e.g., deposition and etching). An example of a host is shown at 958 in FIG. 9, although embodiments are not limited to being coupled to the memory system 962 shown in FIG. 9. The instructions may be sent via a host interface 960 to the controller 858 of the processing apparatus 851. The instructions may be based at least in part on scaled preferences (e.g., in numerically and/or structurally defined gradients) stored by the host 958, provided via input from another storage system (not shown), and/or provided via input from a user (e.g., a human operator), among other possibilities. The controller 858 may be configured to enable input of the instructions and scaled preferences to define the CDs of the fabrication of the semiconductor structure to be implemented by the processing apparatus 851.

The scaled preferences may determine final structures (e.g., the CDs) the pillars, a sidewalls of the pillars, a width of the pillars, a width of the isolation trench, and/or a depth of the isolation trench, along with positioning and/or amounts of the dielectric materials described herein, among other components and operations. Particular CDs may be enabled by the particular scaled preferences that are input via the instructions. Receipt and implementation of the scaled preferences by the controller 858 may result in corresponding adjustment, by the processing apparatus 851, of a deposition time for the dielectric materials, adjustment of a coverage area, height, and/or volume of the dielectric materials, and/or adjustment of a trim direction and/or trim time performed on the dielectric materials, among implementation of other possible scaled preferences.

The controller 858 may, in a number of embodiments, be configured to use hardware as control circuitry. Such control circuitry may, for example, be an application specific integrated circuit (ASIC) with logic to control fabrication steps, via associated deposition and etch processes, for pillar formation adjacent an isolation trench, along with formation of dielectric materials on and removal of the dielectric materials from the pillar and the isolation trench. The controller 858 may be configured to receive the instructions and direct performance of operations to perform semiconductor structure and/or isolation trench fabrication methods as described in connection with FIGS. 1-7.

FIG. 9 is a functional block diagram of a computing system 956 including at least one memory system 962 in accordance with one or more embodiments of the present disclosure. The numbering convention used in connection with FIG. 9 does not follow the earlier introduced numbering convention and sequence that applies to FIGS. 1-7. Memory system 962 may be, for example, a solid-state drive (SSD).

In the embodiment illustrated in FIG. 9, memory system 962 includes a memory interface 964, a number of memory devices 968-1, . . . , 968-N, and a controller 966 selectably coupled to the memory interface 964 and memory devices 968-1, . . . , 968-N. Memory interface 964 may be used to communicate information between memory system 962 and another device, such as a host 958. Host 958 may include a processor (not shown). As used herein, "a processor" may be a number of processors, such as a parallel processing system, a number of coprocessors, etc. Example hosts may include, or by implemented in, laptop computers, personal computers, digital cameras, digital recording devices and playback devices, mobile telephones, personal digital assistants (PDAs), memory card readers, interface hubs, and the like. Such a host 958 may be associated with fabrication operations performed on semiconductor devices and/or SSDs using, for example, a processing apparatus shown at 851 and described in connection with FIG. 8.

In a number of embodiments, host 958 may be associated with (e.g., include or be coupled to) a host interface 960. The host interface 960 may enable input of scaled preferences (e.g., in numerically and/or structurally defined gradients) to define, for example, critical dimensions (CDs) of a final structure or intermediary structures of a memory device (e.g., as shown at 968) and/or an array of memory cells (e.g., as shown at 970) formed thereon to be implemented by the processing apparatus 951. The array includes transistors having an isolation trench formed according to embodiments described herein. The scaled preferences may be provided to the host interface 960 via input of a number of preferences stored by the host 958, input of preferences from another storage system (not shown), and/or input of preferences by a user (e.g., a human operator).

Memory interface 964 may be in the form of a standardized physical interface. For example, when memory system 962 is used for information (e.g., data) storage in computing system 956, memory interface 964 may be a serial advanced technology attachment (SATA) interface, a peripheral component interconnect express (PCIe) interface, or a universal serial bus (USB) interface, among other physical connectors and/or interfaces. In general, however, memory interface 964 may provide an interface for passing control, address, information, scaled preferences, and/or other signals between the controller 966 of memory system 962 and a host 958 (e.g., via host interface 960).

Controller 966 may include, for example, firmware and/or control circuitry (e.g., hardware). Controller 966 may be operably coupled to and/or included on the same physical device (e.g., a die) as one or more of the memory devices 968-1, . . . , 968-N. For example, controller 966 may be, or may include, an ASIC as hardware operably coupled to circuitry (e.g., a printed circuit board) including memory interface 964 and memory devices 968-1, . . . , 968-N. Alternatively, controller 966 may be included on a separate physical device that is communicatively coupled to the physical device (e.g., the die) that includes one or more of the memory devices 968-1, . . . , 968-N.

Controller 966 may communicate with memory devices 968-1, . . . , 968-N to direct operations to sense (e.g., read), program (e.g., write), and/or erase information, among other functions and/or operations for management of memory cells. Controller 966 may have circuitry that may include a number of integrated circuits and/or discrete components. In a number of embodiments, the circuitry in controller 966 may include control circuitry for controlling access across memory devices 968-1, . . . , 968-N and/or circuitry for providing a translation layer between host 958 and memory system 962.

Memory devices 968-1, . . . , 968-N may include, for example, a number of memory arrays 970 (e.g., arrays of volatile and/or non-volatile memory cells). For instance, memory devices 968-1, . . . , 968-N may include arrays of memory cells, such as a portion of an example memory device structured to include sense line contacts. At least one array includes a transistor having a gate structure formed according to the embodiments disclosed herein. As will be appreciated, the memory cells in the memory arrays 970 of memory devices 968-1, . . . , 968-N may be in a RAM architecture (e.g., DRAM, SRAM, SDRAM, FeRAM, MRAM, ReRAM, etc.), a flash architecture (e.g., NAND, NOR, etc.), a three-dimensional (3D) RAM and/or flash memory cell architecture, or some other memory array architecture including pillars and adjacent trenches.

Memory device 968 may be formed on the same die. A memory device (e.g., memory device 968-1) may include one or more arrays 970 of memory cells formed on the die. A memory device may include sense circuitry 972 and control circuitry 974 associated with one or more arrays 970 formed on the die, or portions thereof. The sense circuitry 972 may be utilized to determine (sense) a particular data value (e.g., 0 or 1) that is stored at a particular memory cell in a row of an array 970. The control circuitry 974 may be utilized to direct the sense circuitry 972 to sense particular data values, in addition to directing storage, erasure, etc., of data values in response to a command from host 958 and/or host interface 960. The command may be sent directly to the control circuitry 974 via the memory interface 964 or to the control circuitry 974 via the controller 966.

The embodiment illustrated in FIG. 9 may include additional circuitry that is not illustrated so as not to obscure embodiments of the present disclosure. For example, memory device 968 may include address circuitry to latch address signals provided over I/O connectors through I/O circuitry. Address signals may be received and decoded by a row decoder and a column decoder to access a memory array 970. It will be appreciated that the number of address input connectors may depend on the density and/or architecture of memory devices 968 and/or memory arrays 970.

In the above detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

It is to be understood that the terminology used herein is for the purpose of describing particular embodiments only and is not intended to be limiting. As used herein, the singular forms "a", "an", and "the" include singular and plural referents, unless the context clearly dictates otherwise, as do "a number of", "at least one", and "one or more" (e.g., a number of memory arrays may refer to one or more memory arrays), whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically and, unless stated otherwise, can include a wireless connection for access to and/or for movement (transmission) of instructions (e.g., control signals, address signals, etc.) and data, as appropriate to the context.

While example embodiments including various combinations and configurations of semiconductor materials, underlying materials, structural materials, dielectric materials, capacitor materials, substrate materials, silicate materials, nitride materials, buffer materials, etch chemistries, etch processes, solvents, memory devices, memory cells, isolation trenches, openings, among other materials and/or components related semiconductor structure formation, have been illustrated and described herein, embodiments of the present disclosure are not limited to those combinations explicitly recited herein. Other combinations and configurations of the semiconductor materials, underlying materials, structural materials, dielectric materials, capacitor materials, substrate materials, silicate materials, nitride materials, buffer materials, etch chemistries, etch processes, solvents, memory devices, memory cells, isolation trenches, openings, among other materials and/or components related semiconductor structure formation, than those disclosed herein are expressly included within the scope of this disclosure.

Although specific embodiments have been illustrated and described herein, those of ordinary skill in the art will appreciate that an arrangement calculated to achieve the same results may be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for semiconductor structure formation, comprising:
    patterning a working surface of a semiconductor wafer;
    performing a vapor etch selective to a first oxide material at the working surface to recess the first oxide material to a first intended depth of an opening relative to the working surface and to expose a second oxide material on a sidewall of the opening; and
    subsequent to performing the vapor etch, performing a wet etch selective to the second oxide material to recess the second oxide material to the first intended depth.

2. The method of claim 1, further comprising:
    repeating the method recited in claim 1 in a number of cycles to recess the opening to a second intended depth that is deeper relative to the working surface;
    wherein the number of cycles is tunable to reach the second intended depth.

3. The method of claim 1, further comprising performing the vapor etch at a pressure of less than 0.15 Torr (T) and at a temperature of less than 40 degrees Celsius (° C.).

4. The method of claim 1, further comprising performing the vapor etch at a pressure of 0.2 Torr (T) or higher and at a temperature of 40 degrees Celsius (° C.) or higher.

5. The method of claim 1, further comprising:
    using at least one of hydrogen fluoride (HF), nitrogen trifluoride ($NF_3$), and ammonia ($NH_3$) as reactants during the vapor etch.

6. The method of claim 1, further comprising:
    using at least one of deionized water ($H_2O$) and dilute hydrogen fluoride (HF) acid in deionized $H_2O$ as reactants during the wet etch.

7. The method of claim 1, further comprising:
    using silicon oxide ($SiO_2$) as the first oxide material; and
    using aluminum oxide ($Al_2O_3$) as the second oxide material.

8. A method for semiconductor structure formation, comprising:
    forming an isolation trench in a plurality of semiconductor materials by:
        performing a vapor etch selective to silicon oxide ($SiO_2$) as a first dielectric material to recess the first dielectric material to an intended depth in the isolation trench;
        exposing, by performance of the vapor etch, aluminum oxide ($Al_2O_3$) as a second dielectric material on a sidewall of the isolation trench; and
        subsequent to exposing, by performance of the vapor etch, performing a wet etch selective to the aluminum oxide ($Al_2O_3$) to recess the aluminum oxide ($Al_2O_3$) on the sidewall to the intended depth.

9. The method of claim 8, further comprising conformally depositing, prior to performance of the vapor etch, the aluminum oxide ($Al_2O_3$) on the sidewall.

10. The method of claim 8, further comprising depositing, prior to performance of the vapor etch, the aluminum oxide ($Al_2O_3$) using an atomic layer deposition (ALD) process.

11. The method of claim 8, further comprising depositing, prior to performance of the vapor etch, the aluminum oxide ($Al_2O_3$) to a thickness in a range of from 1 nanometer (nm) to 5 nm.

12. The method of claim 8, further comprising:
    forming, prior to performance of the vapor etch, an opening in the aluminum oxide ($Al_2O_3$) on a surface of a substrate and between sidewalls of a pair of adjacent pillars; and
    depositing the first dielectric material to substantially fill the opening in the aluminum oxide ($Al_2O_3$).

13. The method of claim 8, further comprising:
    forming, prior to performance of the vapor etch, a third dielectric material on a surface of a substrate and on sidewalls of a pair of adjacent pillars to form an opening therebetween, wherein the third dielectric material is formed to a thickness in a range of from 1 nanometers (nm) to 5 nm; and forming the aluminum oxide ($Al_2O_3$) on a surface of the opening.

14. The method of claim 13, further comprising:

using a silicon oxide ($SiO_2$) for the third dielectric material;

using at least one of silicon (Si), poly-Si, amorphous Si, and doped Si for the pillars; and using at least one of Si, poly-Si, and amorphous Si for the substrate.

15. A method for semiconductor structure formation, comprising:

forming an isolation trench in a plurality of semiconductor materials by:

vapor etching an opening into a silicon oxide ($SiO_2$) material formed over aluminum oxide ($Al_2O_3$) material to expose the aluminum oxide ($Al_2O_3$) material on a sidewall of the opening, wherein a reactant used for the vapor etching is selective to the silicon oxide ($SiO_2$) material relative to the aluminum oxide ($Al_2O_3$) material; and subsequent to vapor etching the opening, wet etching the aluminum oxide ($Al_2O_3$) material exposed on the sidewall of the opening, wherein a reactant used for the wet etching is selective to the aluminum oxide ($Al_2O_3$) material relative to silicon oxide ($SiO_2$) material; wherein:

the vapor etching recesses the opening in the silicon oxide ($SiO_2$) material to an intended depth relative to a working surface of the plurality of semiconductor materials;

the wet etching recesses the exposed aluminum oxide ($Al_2O_3$) material on the sidewall of the opening to the intended depth; and selectivity of the wet etching to the exposed aluminum oxide ($Al_2O_3$) material leaves an exposed surface of the silicon oxide ($SiO_2$) material substantially at the intended depth.

16. The method of claim 15, wherein the vapor etching being selective to silicon oxide ($SiO_2$) material comprises the vapor etching leaving an exposed surface of the aluminum oxide ($Al_2O_3$) material on the sidewall of the opening substantially at a deposited thickness.

17. The method of claim 15, further comprising the wet etching leaving an exposed surface of the aluminum oxide ($Al_2O_3$) material and the exposed surface of the silicon oxide ($SiO_2$) material substantially at an intended depth in the isolation trench.

18. The method of claim 15, further comprising:

forming the plurality of semiconductor materials over a substrate structure that comprises a pair of adjacent pillars; and forming the isolation trench between the pair of adjacent pillars.

19. The method of claim 15, further comprising:

recessing to the intended depth, by the wet etching, an exposed surface of the aluminum oxide ($Al_2O_3$) material on the sidewall to serve as a liner at a bottom portion of the isolation trench; and recessing to the intended depth, by the vapor etching, an exposed surface of the silicon oxide ($SiO_2$) material within the liner to integrate the liner and the silicon oxide ($SiO_2$) material at the bottom portion of the isolation trench.

20. The method of claim 15, further comprising:

forming the aluminum oxide ($Al_2O_3$) material to have a negative bias relative to a channel bias to an adjacent active area of a buried recessed access device (BRAD) associated with a pair of adjacent pillars; and recessing the aluminum oxide ($Al_2O_3$) material to a bottom portion of the isolation trench enables electrostatic control of a threshold voltage (Vt) of the channel.

21. The method of claim 15, further comprising forming the isolation trench to have a width of fifteen (15) nm or less, a height of two hundred (200) nm or greater, and an aspect ratio of fifteen to one (15:1) or greater.

* * * * *